(12) United States Patent
Li (10) Patent No.: US 12,148,670 B2
(45) Date of Patent: Nov. 19, 2024

(54) METHOD FOR MANUFACTURING FIN FIELD EFFECT TRANSISTOR

(71) Applicant: Shanghai Huali Integrated Circuit Corporation, Shanghai (CN)

(72) Inventor: Yong Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 392 days.

(21) Appl. No.: 17/692,992

(22) Filed: Mar. 11, 2022

(65) Prior Publication Data

US 2022/0293472 A1  Sep. 15, 2022

(30) Foreign Application Priority Data

Mar. 15, 2021 (CN) .......................... 202110273758.2

(51) Int. Cl.
*H01L 21/8234* (2006.01)
*H01L 21/762* (2006.01)
*H01L 29/66* (2006.01)
*H01L 29/78* (2006.01)

(52) U.S. Cl.
CPC .... *H01L 21/823431* (2013.01); *H01L 21/762* (2013.01); *H01L 29/66795* (2013.01); *H01L 29/7851* (2013.01)

(58) Field of Classification Search
CPC ........... H01L 21/823431; H01L 21/762; H01L 29/7851; H01L 21/823821; H01L 27/0924; H01L 21/845; H01L 29/66537; H01L 29/1083; H01L 29/785–7856; H01L 2029/7857–7858; H01L 29/66795–66818

See application file for complete search history.

(56) References Cited

U.S. PATENT DOCUMENTS

| | | | |
|---|---|---|---|
| 9,881,918 B1 * | 1/2018 | Huang | H01L 21/76237 |
| 2019/0006361 A1 * | 1/2019 | Zhou | H01L 29/66795 |
| 2021/0066506 A1 * | 3/2021 | Liaw | H01L 29/66795 |

* cited by examiner

*Primary Examiner* — Shahed Ahmed
(74) *Attorney, Agent, or Firm* — Banner & Witcoff, Ltd.

(57) ABSTRACT

The present application discloses a method for manufacturing fin field effect transistors, comprising: step 1: performing first time etching to form top portions of fins, each of the top portions is divided into a first section and a second section; step 2: forming sacrificial sidewalls on the side surfaces of the second section but not on the side surfaces of the first section; step 3: forming a doped dielectric layer to coat the side surfaces of the first section; step 4: performing a dopant drive process to diffuse dopants of the doped dielectric layer into the first section; step 5: removing the doped dielectric layer and the sacrificial sidewalls; step 6: performing second time etching to form bottom portions of the fins; and step 7: forming a dielectric isolation layer between adjacent fins.

16 Claims, 7 Drawing Sheets

METHOD FOR MANUFACTURING FIN FIELD EFFECT TRANSISTOR

CROSS-REFERENCES TO RELATED APPLICATIONS

This application claims the priority to Chinese patent application No. CN202110273758.2, filed on Mar. 15, 2021, and entitled "METHOD FOR MANUFACTURING FIN FIELD EFFECT TRANSISTOR", the disclosure of which is incorporated herein by reference in entirety.

TECHNICAL FIELD

The present application relates the field of semiconductor integrated circuit manufacturing, in particular, to a method for manufacturing a fin field effect transistor (FinFET).

BACKGROUND

Figure 1:
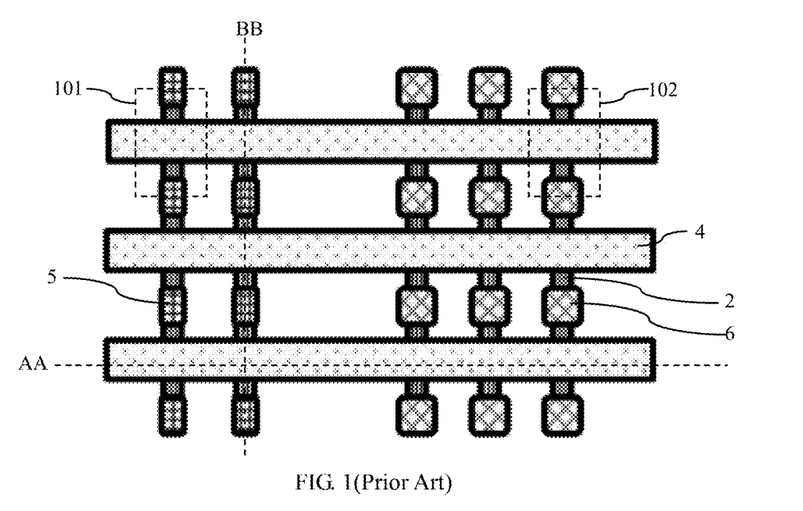
FIG. 1 is a plan view of existing first type fin field effect transistors.
Figure 2:
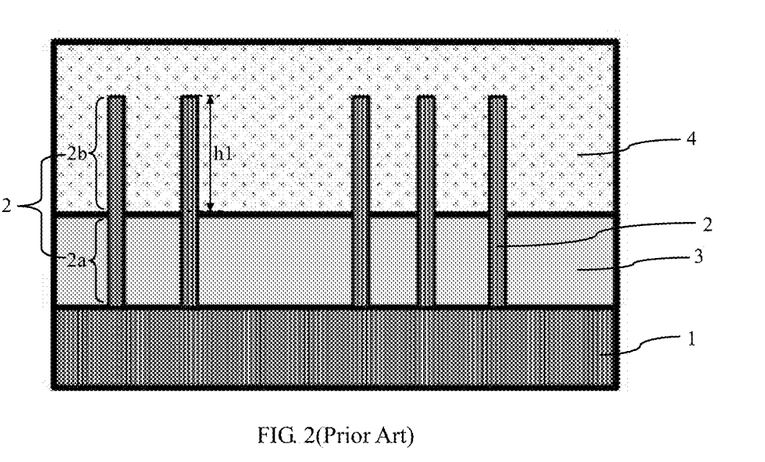
FIG. 2 is a cross sectional view cut along the dashed line AA in FIG. 1.
Figure 3:
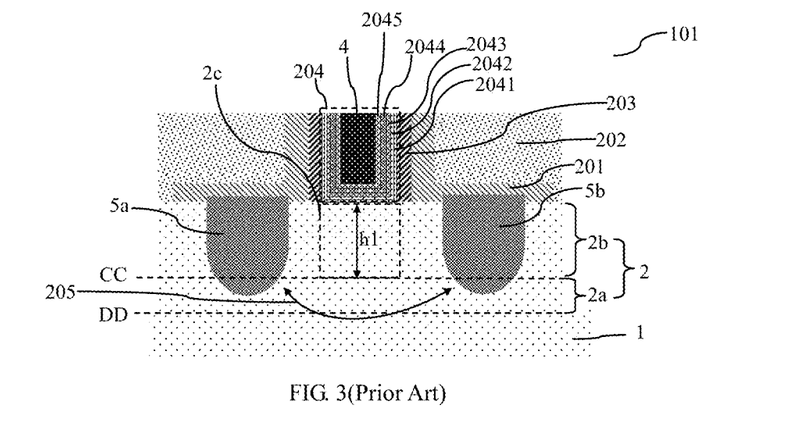
FIG. 3 is a cross sectional view cut along the dashed line BB in FIG. 1.

With the development of the semiconductor process technology, the gate widths have been reduced continuously, and the conventional planar CMOS devices can no longer satisfy technology requirements, one important issue being controlling on the short channel effect. At a technology node below 20 nm, the fin field effect transistor structures have better electrical performance. FIG. 1 is a plan view of existing first type fin field effect transistors; FIG. 2 is a cross sectional view along a dashed line AA in FIG. 1; and FIG. 3 is a cross sectional view along a dashed line BB in FIG. 1. The method making the existing first type fin field effect transistor includes the following:

A fin 2 is formed on a semiconductor substrate such as a silicon substrate 1, wherein the bottom of the fin 2 is isolated from the substrate by an insulation layer 3, and the insulation layer 3 is generally the shallow trench isolation (STI).

The top surface and side surfaces of the fin 2 are covered with a metal gate (MG). Generally, a gate dielectric layer comprising a high dielectric-constant (HK) layer 2042 is provided between the metal gate and the material of the fin 2 for isolation, and the gate structure 204 in the dashed line box in FIG. 3 constitutes the HKMG. It can be seen from the plan view of FIG. 1 that, there are a plurality of fins 2 arranged in parallel, there are a plurality of metal gates arranged in parallel, and the length direction of each metal gate is perpendicular to the length direction of each of the fins 2. It can be seen from FIG. 3 that, the gate structure is in the dashed line box 204, and the gate dielectric layer of the gate structure 204 includes a stack of an interface layer 2041, the high dielectric-constant layer 2042, and the bottom bather metal 2043. The metal gate of the gate structure 204 includes a work function layer 2044, top barrier metal 2045, and a metal conductive material layer 4 that are stacked up in sequence. FIG. 1 illustrates the metal conductive material layer 4 in a top view structure. Sidewalls 203 are formed on the side surfaces of the gate structure 204, a contact etch stop layer (CESL) 201 covers the side surfaces of the sidewall 203 and the top surfaces of the silicon substrate 1 and the insulation layer 3 outside the gate structure 204, in addition, a zeroth interlayer film 202 is formed in a spacing area between the adjacent gate structures 204.

FIG. 1 illustrates an N-type fin field effect transistor 101 and a P-type fin field effect transistor 102. A source area and a drain area are formed on two sides of the metal gate of the N-type fin field effect transistor 101, and an embedded SiP epitaxial layer 5 is formed in each of the source area and the drain area. A source area and a drain area are formed on two sides of the metal gate of the P-type fin field effect transistor 102, and an embedded SiGe epitaxial layer 6 is formed in each of the source area and the drain area. The embedded SiGe epitaxial layer 6 and the embedded SiP epitaxial layer 5 are formed by means of epitaxy growth after etching of the fins 2.

The work function layer of the N-type fin field effect transistor 101 is an N-type work function layer. The work function layer of the P-type fin field effect transistor 102 is a P-type work function layer.

It can be seen from FIG. 2 that, each of the fins 2 includes a bottom portion 2a and a top portion 2b, and the bottom portion 2a is arranged in the insulation layer 3. The metal gate covers the top surface and side surfaces of the top portion 2b of each fin 2. Referring to FIG. 3, the top portion 2b of the fin 2 covered by the metal gate serves as a channel area 2c. As can be seen from FIG. 2, the height of the top portion 2b of the fin 2 is h1, and h1 is also the height of the channel area 2c. FIG. 3 also shows that the height of the channel area 2c is h1.

FIG. 3 is a cross sectional structural diagram of the N-type fin field effect transistor 101. It can be seen that the source area 5a and the drain area 5b are formed on the two sides of the gate structure 204, and the embedded SiP epitaxial layer 5 is formed in each of the source area 5a and the drain area 5b.

In FIG. 3, the dashed line CC represents the line dividing the bottom portion 2a and the top portion 2b of the fin 2, and the dashed line DD represents the line through the bottom surface of the bottom portion 2a of the fin 2. The control of the gate structure 204 from charge carriers in an area near the dashed line CC labeled as reference number 205 can be weakened, because the source area 5a and the drain area 5b are prone to depletion in this area 205, the depleted area near 205 might cause connection of the source area 5a and the drain area 5b to each other, resulting in punchthrough. So electric leakage may occur between the source area 5a and the drain area 5b due to the punchthrough of the depletion areas. Therefore an anti-punchthrough (APT) layer is generally required to prevent the punchthrough.

Figure 4:
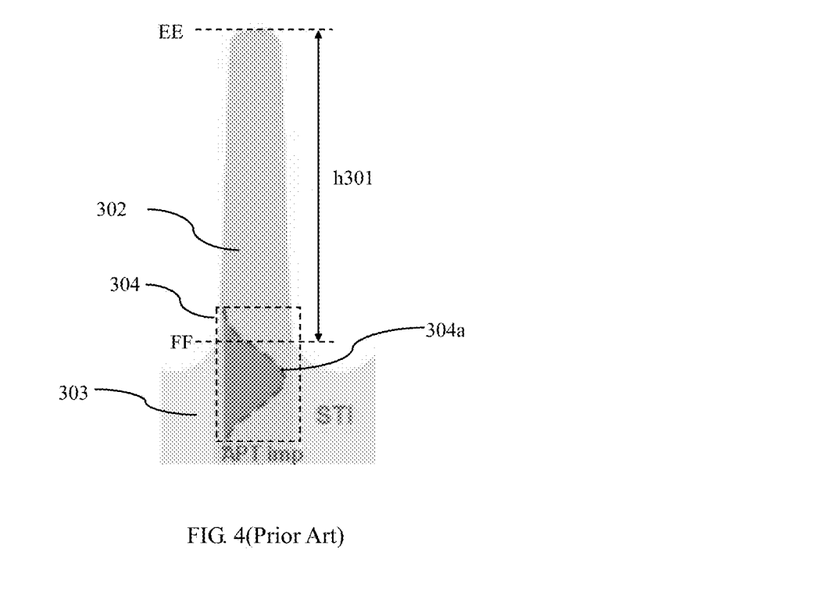
FIG. 4 is a schematic structural diagram of a fin of the second type fin field effect transistor with an existing anti-punchthrough layer.

FIG. 4 is a schematic structural diagram of a fin of the second type fin field effect transistor with an existing anti-punchthrough layer. FIG. 4 illustrates a fin 302 and an insulation layer 303 composed of STI. An area between dashed lines EE and FF is a top area of the fin 302, and the height h301 of the top area of the fin 302 is the height of a channel area. An anti-punchthrough layer 304 is formed at the bottom of the top part of the fin 302. In the existing technique, the anti-punchthrough layer 304 is generally formed by means of an ion implantation process. Existing data indicates that the anti-punchthrough layer 304 formed by the this method has the following defects.

First of all, the ion implantation causes implantation damage, and such ion implantation damage reduces the carrier mobility of the channel area, thereby degrading the device performance.

Secondly, as can be seen from the doping distribution morphology, which is represented by a reference numeral 304a, of the anti-punchthrough layer 304 formed by the ion implantation, the doping concentration of the anti-punchthrough layer 304 gradually decreases from the peak position to the upper end and to the lower end, and an upper tail formed during a doping decreasing process enters the top area of the fin 302. Since the channel area is formed in the top area of the fin 302, the tail doping of the anti-punchthrough layer 304 affects the doping of the channel area, finally affecting the performance of the channel area, such as the threshold voltage and carrier mobility, and thereby degrading the device performance.

BRIEF SUMMARY

The technical problem to be solved by the present application is to provide a method for manufacturing a fin field effect transistor, to form a damage-free heavily-doped anti-punchthrough layer at the bottom of the channel layer, without affecting the carrier mobility of the channel layer.

The method for manufacturing a fin field effect transistor provided by the present application comprises the following steps:

step 1: providing a semiconductor substrate, defining formation area of a fins, and performing the first time etching on the semiconductor substrate on the fins to form the top portions of the fins, each of the top portion has a first section and a second section, the second section is superposed on the top of the first section, and the second section serves as a channel layer;

step 2: forming sacrificial sidewalls on the side surfaces of the second section, wherein the sacrificial sidewalls are not disposed on the side surfaces of the first section;

step 3: forming a doped dielectric layer to coat the side surfaces of the first section;

step 4: performing a dopant drive process to diffuse dopants in the doped dielectric layer into the first section to achieve doping of the first section, wherein the doped first section serves as an anti-punchthrough layer;

step 5: removing the doped dielectric layer and the sacrificial sidewalls;

step 6: performing the second time etching on the semiconductor substrate to form a bottom portion of each fin, wherein each of the fins now has the bottom portion under the top portion; and step 7: forming a dielectric isolation layer between adjacent two fins, wherein the top surface of the dielectric isolation layer aligns to between the top surface and the bottom surface of the anti-punchthrough layer.

In a further improvement, the semiconductor substrate comprises a silicon substrate.

In a further improvement, the fin field effect transistor comprises an N-type fin field effect transistor and a P-type fin field effect transistor.

In a further improvement, in a formation area of the N-type fin field effect transistor, the doped dielectric layer is a P-type doped dielectric layer, and the anti-punchthrough layer is a P-type anti-punchthrough layer.

In a further improvement, in the formation area of the N-type fin field effect transistor, the top portion is subjected to intrinsic doping or P-type doping in step 1.

In a further improvement, the P-type doped dielectric layer is a borosilicate glass (BSG) film.

In a further improvement, in a formation area of the P-type fin field effect transistor, the doped dielectric layer is an N-type doped dielectric layer, and the anti-punchthrough layer is an N-type anti-punchthrough layer.

In a further improvement, in the formation area of the P-type fin field effect transistor, the top portion is subjected to intrinsic doping or N-type doping in step 1.

In a further improvement, the N-type doped dielectric layer is a phosphosilicate glass (PSG) film.

In a further improvement, step 1 comprises the following sub-steps:

step 11: forming a hard mask layer on the surface of the semiconductor substrate;

step 12: forming a photoresist pattern, the photoresist pattern covering the formation area of the fin and opening an area other than the formation area of the fin;

step 13: etching the hard mask layer to transfer a pattern structure of the photoresist pattern into the hard mask layer; and step 14: performing the first time etching on the semiconductor substrate by using the hard mask layer as a mask.

The photoresist pattern is removed after the etching of the hard mask layer in step 13 is completed or after the first time etching in step 14 is completed.

In a further improvement, step 2 comprises the following sub-steps:

depositing an organic dielectric layer (ODL), the organic dielectric layer arranged between spacing areas of the top portion for filling, and the organic dielectric layer having a height equal to the height of the first section;

performing self-aligned deposition and etching processes to form the doped dielectric layer on the side surfaces of the top portion of the fins, wherein the doped dielectric layer covers the sacrificial sidewalls and the side surfaces of the first section; and removing the organic dielectric layer.

In a further improvement, step 3 comprises the following sub-step:

performing self-aligned deposition and etching processes to form the doped dielectric layer on the side surfaces of the top portions of the fins, so the doped dielectric layer covers the sacrificial sidewalls of the second section and the side surfaces of the first section.

In a further improvement, in step 4, the dopant drive process is implemented by means of thermal annealing, and process conditions of the dopant drive process comprise: a temperature of 1050° C., a time of 30 seconds, and an ambient atmosphere of oxygen.

In a further improvement, step 7 comprises the following sub-steps:

step 71: depositing a material layer of the dielectric isolation layer to completely fill a spacing area between the fins, the material layer extending to the surface of the fin;

step 72: performing a chemical mechanical planarization process to make the surface of the material layer of the dielectric isolation layer flush with the surface of the fin; and step 73: etching back the material layer of the dielectric isolation layer to form the dielectric isolation layer.

In a further improvement, in step 71, the material layer of the dielectric isolation layer is deposited by means of a flowable chemical vapor deposition (FCVD) process.

In a further improvement, the top surface of the dielectric isolation layer is arranged at an intermediate position between the top surface and the bottom surface of the anti-punchthrough layer.

The fins of the present application are formed by two times of etching. After the first time etching is completed, the top portion of the fin is divided into two sections as needed to form the channel layer and the anti-punchthrough layer, and then the sacrificial sidewall is formed to cover the side surface of the top second section, so that the side surface of the bottom first section can be covered with the doped dielectric layer and the dopant of the doped dielectric layer can be diffused into the first section to achieve the doping of the first section and form the anti-punchthrough layer. Therefore, in the present application, the doping of the anti-punchthrough layer can be implemented by means of solid-phase source doping. Compared with ion implantation doping, the solid-phase source doping produces no ionic defects and can prevent the dopants from diffusing upwards into the channel layer. Finally, in the present application, the damage-free heavily-doped anti-punchthrough layer can be formed at the bottom of the channel layer, without affecting the carrier mobility of the channel layer, thereby achieving high carrier mobility and improving the device performance.

BRIEF DESCRIPTION OF THE DRAWINGS

The present application will be further described in detail below with reference to the drawings and specific implementations.

DETAILED DESCRIPTION OF THE DISCLOSURE

Figure 5:
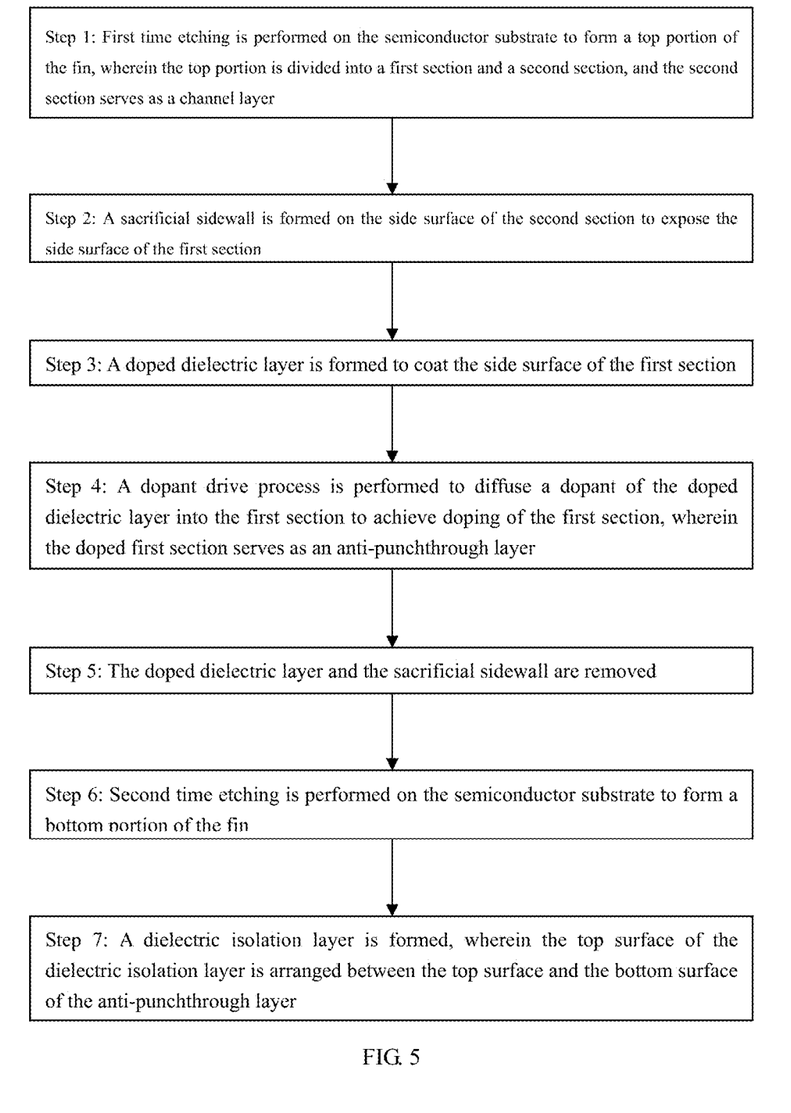
FIG. 5 is a flowchart of a method for manufacturing fin field effect transistors according to an embodiment of the present application.

FIG. 5 is a flowchart of a method for manufacturing fin field effect transistors according to an embodiment of the present application. FIGS. 6A-6I are schematic diagrams of device structures in steps of the method of manufacturing fin field effect transistors according to the embodiment of the present application. The method of manufacturing fin field effect transistors according to the embodiment of the present application includes the following steps.

Figure 6A:
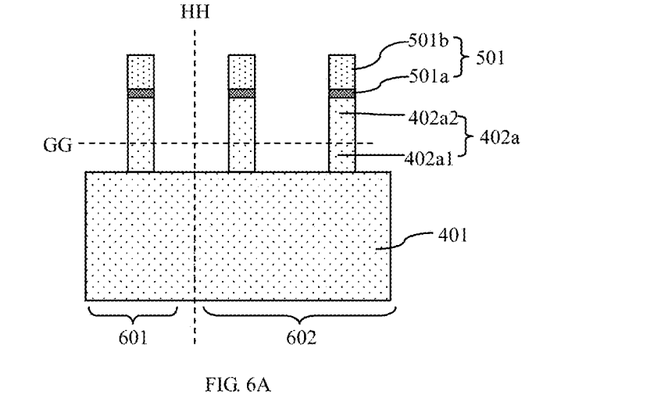
FIGS. 6A-6I are schematic diagrams of device structures in steps of the method of manufacturing fin field effect transistors according to the embodiment of the present application.

Step 1: Referring to FIG. 6A, a semiconductor substrate 401 is provided, a formation area of fins 402 is defined, and first time etching is performed on the semiconductor substrate 401 to form top portions 402a of the fins 402.

In the method of the embodiment of the present application, the semiconductor substrate 401 includes a silicon substrate.

The fin field effect transistor includes an N-type fin field effect transistor and a P-type fin field effect transistor. In FIG. 6A, the left side of the dashed line HH corresponds to a formation area 601 of the N-type fin field effect transistor, and the right side of the dashed line HH corresponds to a formation area 602 of the P-type fin field effect transistor.

The top portion 402a is divided into a first section 402a1 and a second section 402a2, and the second section 402a2 is on top of the first section 402a1. In FIG. 6A, the dashed line GG passes through the interfaces between the first section 402a1 and the second section 402a2.

The second section 402a2 serves as a channel layer.

In the formation area 601 of the N-type fin field effect transistor, the top portion 402a is subjected to intrinsic doping or P-type doping.

In the formation area 602 of the P-type fin field effect transistor, the top portion 402a is subjected to intrinsic doping or N-type doping.

In some examples, step 1 includes the following sub-steps.

Step 11: A hard mask layer 501 is formed on the surface of the semiconductor substrate 401.

The hard mask layer 501 is formed by stacking an oxide layer 501a and a nitride layer 501b.

Step 12: A photoresist pattern is formed, the photoresist pattern covers the formation area of the fins 402 and opens an area other than the formation area of the fins 402.

Step 13: The hard mask layer 501 is etched to transfer a pattern structure of the photoresist pattern into the hard mask layer 501.

Step 14: The first time etching is performed on the semiconductor substrate 401 by using the hard mask layer 501 as a mask.

The photoresist pattern is removed after the etching of the hard mask layer 501 in step 13 is completed or after the first time etching in step 14 is completed.

Step 2: Referring to FIG. 6C, sacrificial sidewalls 503 are formed on the side surfaces of the second section 402a2, however the sacrificial sidewalls 503 does not over the side surfaces of the first section 402a1.

In the method of the embodiment of the present application, step 2 includes the following sub-steps.

Figure 6B:
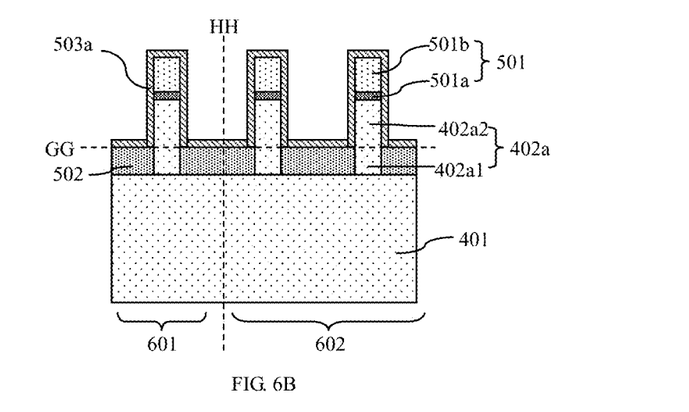
Figure 6C:
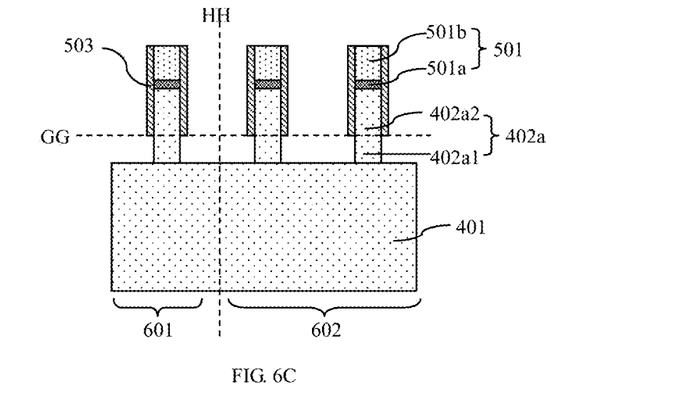

Referring to FIG. 6B, an organic dielectric layer 502 is disposed to fill into the spacing areas between adjacent top portions 402a, and the thickness of the organic dielectric layer 502 equals to the height of the first section 402a1, align to the dashed line GG.

Referring to FIG. 6B, a deposition process of the sacrificial top surface and the sidewalls 503a is performed with the material of the sacrificial sidewalls.

Referring to FIG. 6C, an etching process of the sacrificial top surface and sidewalls 503 having the sacrificial material is performed to form the sacrificial sidewalls 503 on the side surfaces of the second section 402a2 in a self-alignment manner.

The organic dielectric layer 502 is removed. After the organic dielectric layer 502 is removed, the side surfaces of the first section 402a1 are exposed.

Figure 6D:
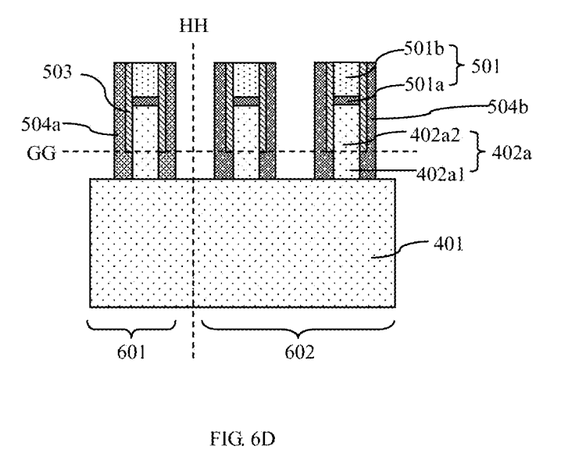

Step 3: Referring to FIG. 6D, a doped dielectric layer is formed to coat the side surfaces of the first section 402a1.

In the method of the embodiment of the present application, step 3 includes the following sub-step.

Self-aligned deposition and etching processes are performed to form the doped dielectric layer on the side surfaces of the top portion of the fins 402a, so the doped dielectric layer covers the sacrificial sidewalls of the second section 402a2 and the side surfaces of the first section 402a1.

In the formation area 601 of the N-type fin field effect transistor, the doped dielectric layer is subjected to P-type doping. In some examples, the doped dielectric layer is a BSG film 504a.

In the formation area 602 of the P-type fin field effect transistor, the doped dielectric layer is subjected to N-type doping. In some examples, the doped dielectric layer is a PSG film 504b.

In the method of the embodiment of the present application, the BSG film 504a and the PSG film 504b need to be formed separately. For example, the BSG film 504a can be formed first, and then the PSG film 504b is formed; in this case, a process sequence is as follows: first, the formation area 601 of the N-type fin field effect transistor is opened and the formation area 602 of the P-type fin field effect transistor is covered, and then the BSG film 504a is formed in the formation area 601 of the N-type fin field effect transistor; next, the formation area 602 of the P-type fin field effect transistor is opened and the formation area 601 of the N-type fin field effect transistor is covered, and then the PSG film 504b is formed in the formation area 602 of the P-type fin field effect transistor. Alternatively, the PSG film 504b is formed first, and then the BSG film 504a is formed, in which case a process sequence is opposite to the sequence described above.

Figure 6E:
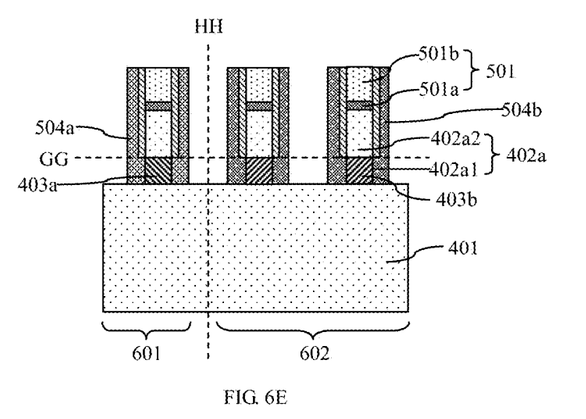

Step 4: Referring to FIG. 6E, a dopant drive process is performed to diffuse dopants of the doped dielectric layer into the first section 402a1 to achieve doping of the first section 402a1, wherein the doped first section 402a1 serves as an anti-punchthrough layer.

In the formation area 601 of the N-type fin field effect transistor, the doped dielectric layer is subjected to P-type doping, and the anti-punchthrough layer is a P-type anti-punchthrough layer 403a.

In the formation area 602 of the P-type fin field effect transistor, the doped dielectric layer is subjected to N-type doping, and the anti-punchthrough layer is an N-type anti-punchthrough layer 403b.

The dopant drive process is implemented by means of thermal annealing, and process conditions of the dopant drive process include: a temperature of 1050° C., a time of 30 seconds, and an ambient atmosphere of oxygen.

Figure 6F:
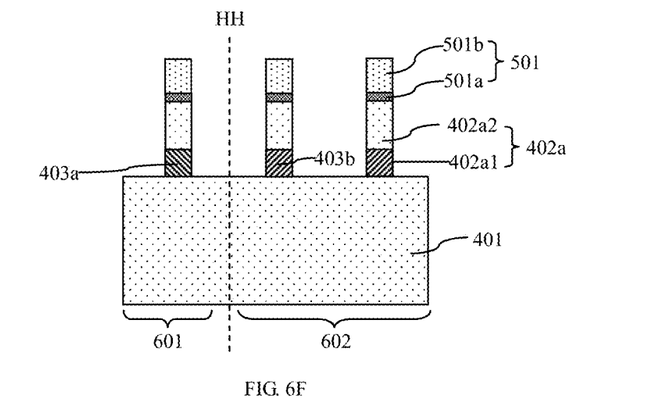

Step 5: Referring to FIG. 6F, the doped dielectric layer and the sacrificial sidewalls 503 are removed.

Figure 6G:
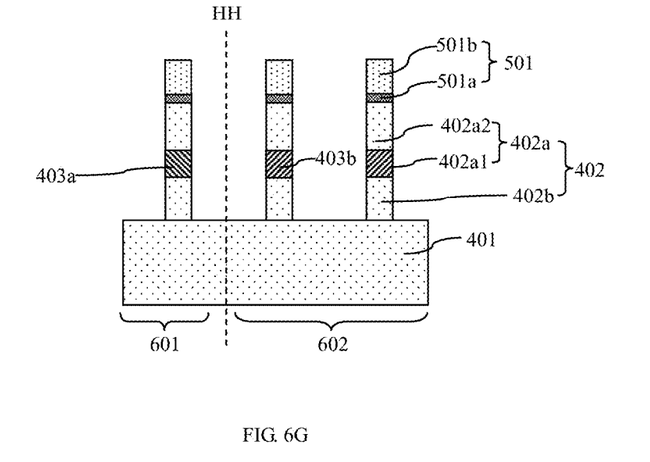

Step 6: Referring to FIG. 6G, second time etching is performed on the semiconductor substrate to form bottom portions 402b of the fins 402, wherein the fins 402 each includes the bottom portion 402b and the top portion 402a.

Figure 6H:
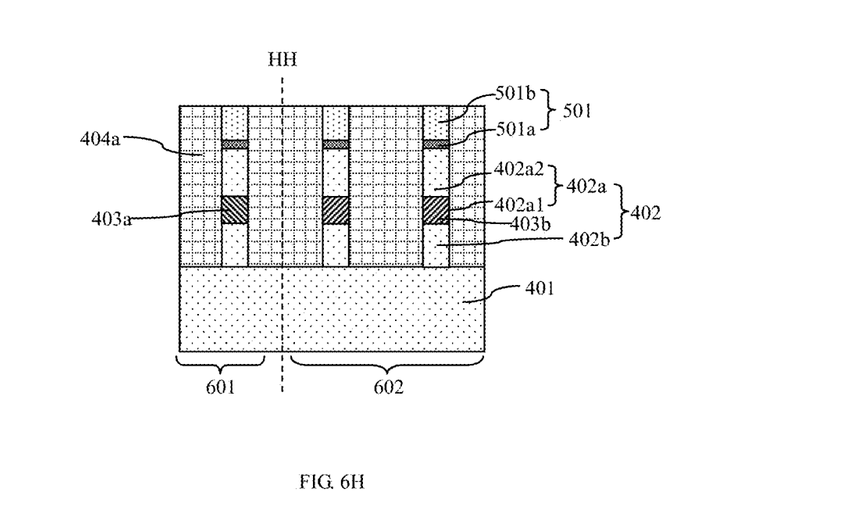
Figure 6I:
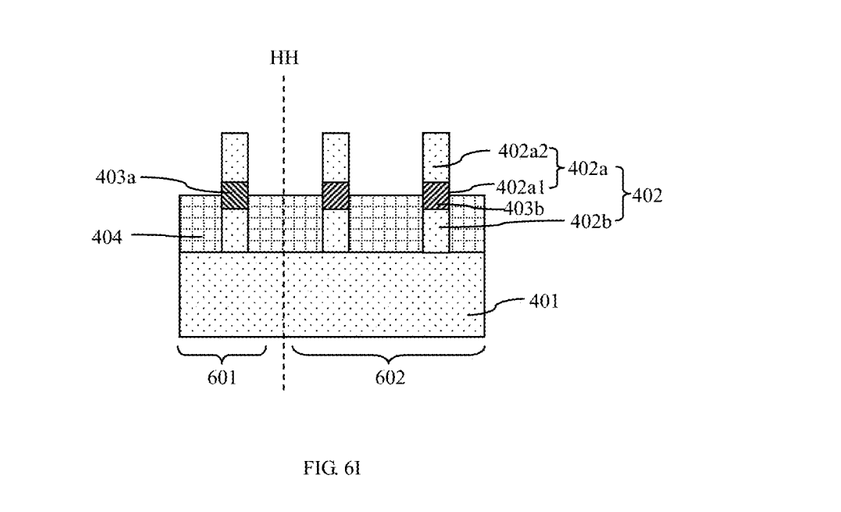

Step 7: Referring to FIG. 6I, a dielectric isolation layer 404 is formed between the fins 402, wherein the top surface of the dielectric isolation layer 404 is arranged between the top surface and the bottom surface of the anti-punchthrough layer.

According to the method of the embodiment of the present application, step 7 includes the following sub-steps.

Step 71: Referring to FIG. 6H, a material layer 404a of the dielectric isolation layer 404 is deposited to fill spacing areas between adjacent fins 402, here the material layer extends to the top surfaces of the fins 402.

In some examples, the material layer 404a of the dielectric isolation layer 404 is deposited by means of an FCVD process. After the FCVD process is completed, an annealing process is usually performed to cure the material layer 404a of the dielectric isolation layer 404.

Step 72: Referring to FIG. 6H, a chemical mechanical planarization process is performed to make the top surface of the material layer 404a of the dielectric isolation layer 404 flush with the top surfaces of the fins 402. However, in the method of the embodiment of the present application, there is the hard mask layer 501 formed on the top surface of each of the fins 402, thus the top surface of the material layer 404a of the dielectric isolation layer 404 is flush with the top surfaces of the hard mask layer 501 on the surfaces of the fins 402, after the chemical mechanical planarization process performed in step 72.

Step 73: Referring to FIG. 6I, the material layer 404a of the dielectric isolation layer 404 is etched back to form the dielectric isolation layer 404. The hard mask layer 501 is removed before or after the etching-back of the dielectric isolation layer 404.

In some examples, the top surface of the dielectric isolation layer 404 is arranged at an intermediate position between the top surface and the bottom surface of the anti-punchthrough layer.

The fin 402 provided with the anti-punchthrough layer can be formed via the steps described above.

Based on the formation of the fin 402, the method further includes the formation of a gate structure of the fin field effect transistor, source and drain areas, and a metal interconnection structure. The formation processes of these structures are the same as those in the existing techniques and will not be described in detail herein.

The fins 402 of the embodiment of the present application are formed by two times of etching. After the first time etching is completed, the top portion 402a of each fin 402 includes two different sections to form the channel layer and the anti-punchthrough layer, and then the sacrificial sidewalls 503 are formed to cover the side surfaces of the top second section 402a2, so that the side surfaces of the bottom first section 402a1 can be attached to the doped dielectric layer and the dopants of the doped dielectric layer can diffuse into the first section 402a1 and form the anti-punchthrough layer. Therefore, according to the embodiment of the present application, the doping of the anti-punchthrough layer can be implemented by means of solid-phase source doping. Compared with doping via ion implantation, the solid-phase source doping produces no ionic defects and can prevent the dopant from diffusing upwards into the channel layer. Finally, in the embodiment of the present application, the damage-free heavily-doped anti-punchthrough layer can be formed at the bottom of the channel layer, without affecting the carrier mobility of the channel layer, thereby achieving high carrier mobility and improving the device performance.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. A method for manufacturing a fin field effect transistor, comprising:
   step 1: providing a semiconductor substrate, defining a formation area of fins, and performing a first time etching on the semiconductor substrate to form a top portion of the fins, wherein the top portion is configured to have a first section under a second section, and wherein the second section serves as a channel layer;
   step 2: forming sacrificial sidewalls on side surfaces of the second section;
   step 3: forming a doped dielectric layer in direct contact with side surfaces of the first section;
   step 4: performing a dopant drive process to diffuse dopants of the doped dielectric layer into the first section, wherein the doped first section serves as an anti-punchthrough layer;
   step 5: removing the doped dielectric layer and the sacrificial sidewalls;
   step 6: performing a second time etching on the semiconductor substrate to form a bottom portion of the fins in a self-aligned manner, wherein each of the fins includes the bottom portion and the top portion; and
   step 7: forming a dielectric isolation layer between the fins, wherein an extension of a top surface of the dielectric isolation layer is arranged between a top surface and a bottom surface of the anti-punchthrough layer.

2. The method for manufacturing the fin field effect transistor according to claim 1, wherein the semiconductor substrate comprises a silicon substrate.

3. The method for manufacturing the fin field effect transistor according to claim 1, wherein the fin field effect transistor comprises an N-type fin field effect transistor and a P-type fin field effect transistor.

4. The method for manufacturing the fin field effect transistor according to claim 3, wherein in a formation area of the N-type fin field effect transistor, the doped dielectric layer is a P-type doped dielectric layer, and the anti-punchthrough layer is a P-type anti-punchthrough layer.

5. The method for manufacturing the fin field effect transistor according to claim 4, wherein in the formation area of the N-type fin field effect transistor, the top portion is subjected to intrinsic doping or P-type doping in step 1.

6. The method for manufacturing the fin field effect transistor according to claim 4, wherein the P-type doped dielectric layer comprises a borosilicate glass (BSG) film.

7. The method for manufacturing the fin field effect transistor according to claim 3, wherein in a formation area of the P-type fin field effect transistor, the doped dielectric layer is an N-type doped dielectric layer, and the anti-punchthrough layer is an N-type anti-punchthrough layer.

8. The method for manufacturing the fin field effect transistor according to claim 7, wherein in the formation area of the P-type fin field effect transistor, the top portion is subjected to intrinsic doping or N-type doping in step 1.

9. The method for manufacturing the fin field effect transistor according to claim 7, wherein the N-type doped dielectric layer comprises a phosphosilicate glass (PSG) film.

10. The method for manufacturing the fin field effect transistor according to claim 1, wherein the first time etching on the semiconductor substrate to form the top portion of the fins comprises in step 1 comprises:
    step 11: forming a hard mask layer on a surface of the semiconductor substrate;
    step 12: forming a photoresist pattern, wherein the photoresist pattern covers the formation area of the fins and opens an area other than the formation area of the fins;
    step 13: etching the hard mask layer to transfer a pattern structure of the photoresist pattern into the hard mask layer;
    step 14: performing the first time etching on the semiconductor substrate by using the hard mask layer as a mask; and
    removing the photoresist pattern after completing the etching of the hard mask layer in step 13 or after completing the first time etching in step 14.

11. The method for manufacturing the fin field effect transistor according to claim 10, wherein the forming the sacrificial sidewalls on the side surfaces of the second section in step 2 comprises:
    depositing an organic dielectric layer to fill between spacing areas of adjacent top portions, wherein a height of the organic dielectric layer is a same as a height of first sections of said adjacent top portions;
    performing self-aligned deposition and etching processes to form the doped dielectric layer on the side surfaces of the top portion of the fins, wherein the doped dielectric layer covers the sacrificial sidewalls of the second section and the side surfaces of the first section; and
    removing the organic dielectric layer.

12. The method for manufacturing the fin field effect transistor according to claim 1, wherein the forming the doped dielectric layer in direct contact with side surfaces of the first section in step 3 comprises:
    performing self-aligned deposition and etching processes to form the doped dielectric layer on the side surfaces of the top portion of the fins, wherein the doped dielectric layer covers the sacrificial sidewalls and the side surfaces of the first section.

13. The method for manufacturing the fin field effect transistor according to claim 1, wherein in step 4, the dopant drive process is implemented by means of thermal annealing, wherein process conditions of the dopant drive process comprise: a temperature of 1050° C., a time of 30 seconds, and an ambient atmosphere of oxygen.

14. The method for manufacturing the fin field effect transistor according to claim 1, wherein the forming the dielectric isolation layer in step 7 comprises:
    step 71: depositing a dielectric material layer to fill spacing areas between the fins, wherein the dielectric material layer extends to top surfaces of the fins;
    step 72: performing a chemical mechanical planarization process to make a surface of the dielectric material layer flush with the top surfaces of the fins; and
    step 73: performing an etching back process on the dielectric material layer to form the dielectric isolation layer.

15. The method for manufacturing the fin field effect transistor according to claim 14, wherein in step 71, the dielectric material layer is deposited by means of a flowable chemical vapor deposition (FCVD) process.

16. The method for manufacturing the fin field effect transistor according to claim 1, wherein the extension of the top surface of the dielectric isolation layer is arranged at an intermediate position between the top surface and the bottom surface of the anti-punchthrough layer.

* * * * *